United States Patent
Kim et al.

(10) Patent No.: US 7,839,080 B2
(45) Date of Patent: Nov. 23, 2010

(54) ORGANIC LIGHT EMITTING DEVICE INCLUDING PHOTO RESPONSIVE MATERIAL AND A METHOD OF FABRICATING THE SAME

(75) Inventors: Hee-kyung Kim, Anyang-si (KR);
Pil-soo Ahn, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 462 days.

(21) Appl. No.: 12/034,217

(22) Filed: Feb. 20, 2008

(65) Prior Publication Data
US 2009/0058272 A1    Mar. 5, 2009

(30) Foreign Application Priority Data
Sep. 5, 2007    (KR)    ............. 10-2007-0089956

(51) Int. Cl.
*H01L 51/00*    (2006.01)
*H01L 51/56*    (2006.01)

(52) U.S. Cl. ............. 313/504; 427/553; 427/508

(58) Field of Classification Search ......... 313/498–512; 427/508, 553
See application file for complete search history.

(56) References Cited

U.S. PATENT DOCUMENTS 5,925,980 A    7/1999    So et al.
6,798,134 B2 *  9/2004    Wang ............. 313/504
2002/0063502 A1 *  5/2002    Wu ............. 313/112
2002/0070662 A1 *  6/2002    Moriyama et al. ......... 313/504
2006/0057424 A1 *  3/2006    Chang et al. ............. 428/690

OTHER PUBLICATIONS

Anna B. Chwang, et al., "Graded mixed-layer OLED's", Proceedings of SPIE, (2003), p. 55-61, vol. 4800.
Jiun-Haw Lee et al., "Mixed host organic light-emitting devices with low driving voltage and long lifetime", Applied Physics Letters, (2005), pp. 103506-1-103506-3.
Yan Shao, et al., "Naturally formed graded junction for organic light-emitting diodes", Applied Physics Letters, (2003), vol. 83 No. 12, Sep. 22, 2003, pp. 2453-2455.

* cited by examiner

*Primary Examiner*—Nimeshkumar D Patel
*Assistant Examiner*—Peter R Haderlein
(74) *Attorney, Agent, or Firm*—Cantor Colburn LLP

(57) ABSTRACT

Provided is a method of fabricating an organic light emitting device using a solution process. The method includes forming an electrode on a lower substrate; depositing an organic active material solution containing at least one photoreactive material on the electrode to form an organic active material layer; and radiating light onto the organic active material layer so that a characteristic of the light varies according to the depth of the organic active material layer in order to gradually vary a molecular orientation structure in the organic active material layer according to the depths, thereby resulting in a carrier mobility gradient according to the depths of the organic active material layer.

22 Claims, 11 Drawing Sheets

ORGANIC LIGHT EMITTING DEVICE INCLUDING PHOTO RESPONSIVE MATERIAL AND A METHOD OF FABRICATING THE SAME

CROSS-REFERENCE TO RELATED PATENT APPLICATIONS

This application claims the benefit of Korean Patent Application No. 10-2007-0089956, tiled on Sep. 5, 2007, in the Korean Intellectual Property Office, the disclosure of which is incorporated herein in its entirety by reference.

BACKGROUND OF THE INVENTION

1. Field of the Invention

The present invention relates to an organic light emitting device (OLED) and a method of fabricating the same and more particularly, to an OLED having an organic active layer with a new molecular orientation structure and a method of fabricating the OLED in which the organic active layer is formed using a solution process.

2. Description of the Related Art

Organic light emitting devices (OLED), which include an anode, a cathode, and an organic active layer including a fluorescent or phosphorescent organic compound between the anode and the cathode, are self-emissive devices which spontaneously emit light as holes supplied from the anode and electrons supplied from the cathode combine with each other. Generally, the organic active layer includes an organic emission layer (EML), a hole transporting layer (HTL) and a hole injecting layer (HIL) between the EML and the anode, and an electron transporting layer (ETL) between the EML and the cathode.

In general, an OLED fabricated by thermal vapor deposition has a heterojunction structure including an HIL, an HTL, an organic EML, and a hole barrier layer (HBL), which are formed of heterogeneous materials, in order to obtain an efficient emission structure. In addition, in order to realize a large size OLED display, thickness uniformity of the layers should be ensured. However, it is difficult to form a large-sized organic active layer having a uniform thickness by the conventional vapor deposition process. Thus, recently a method of coating an organic material by a solution process, which is a wet process, has been suggested. In the solution process, a solution of an organic material, having a high solubility, dissolved in a solvent is coated by spin coating, inkjet coating, or the like. However, fundamentally this solution process is not suitable for forming a multi-layer structure because a solvent used to form an upper layer may melt a lower layer.

Meanwhile, Franky So (U.S. Pat. No. 5,925,980), J. J. Brown (Proceedings of SPIE Vol. 4800 (2003)), C. Wu (Appl. Phys. Lett. Vol. 86103506 (2005)), Yang Yang (Appl. Phys. Lett. Vol. 832453 (2003)), and others reported results on efficiency improvement or lifespan increase when a graded junction forming method is used, in which one of the layers in an OLED has the same composition as an adjacent layer, but with a composition gradient.

SUMMARY OF THE INVENTION

The present invention provides an organic light emitting device (OLED) with a high-efficiency, long-lifespan organic active layer, and a method of fabricating the OLED, in which the overall fabrication process is simplified by using a solution process and the molecular arrangement structure in an organic active layer gradually varies according to depth, so that a mobility gradient of the mobility of holes and electrons varies gradually.

According to an aspect of the present invention, there is provided a method of fabricating an organic light emitting device, the method including forming a lower substrate on a substrate; depositing an organic active material solution containing at least one photoreactive material on the lower substrate to form an organic active material layer, and radiating light onto the organic active material layer so that a characteristic of the light varies according to the depth of the organic active material layer in order to gradually vary a molecular orientation structure in the organic active material layer according to the depths, thereby resulting in a carrier mobility gradient according to the depths of the organic active material layer.

The at least one photoreactive material may include one of a photopolymerizable material, a photoisomerizable material, and a photodecomposable material. The organic active material layer may include at least one selected from among an organic emitting material, an electron transporting material, and a hole transporting material. The method may further include adding a p-type or n-type dopant that increases electrical conductivity to the organic active material layer. The organic active material solution may further include a photoinitiator.

According to another embodiment of the present invention, a method of fabricating an OELD may include forming an organic active material layer as a thin film by depositing a mixed solution containing a photoreactive material and radiating light onto the organic active material layer, wherein the intensity of light varies according to the depth of the organic active material layer so that a molecular orientation structure (for example, the degree of polymerization, molecular orientation, or order parameter) also varies according to the depth of the resulting organic active layer.

For example, the at least one photoreactive material may be a photopolymerizable material. The photopolymerizable material may be added in the form of a monomer into the solution for forming the organic active material layer so that the photopolymerizable material in the form of a monomer polymerizes into a molecular orientation structure with a degree of polymerization that varies depending on the intensities of light that has reached the organic active material layer. The degree of polymerization varies with the depth of the organic active material layer. The photopolymerizable material may be a carrier transporting material or an electroluminescent material.

In an exemplary method of gradually varying the intensity of light reaching the organic active material layer, when light is radiated onto the organic active material layer, a coherent light source may be used to form an interference pattern of light with an intensity gradient which varies according to the depth of the opposite active material layer. In particular, two coherent light sources may be arranged on upper and lower surfaces of the organic active material layer to face each other, and the two coherent light sources may radiate phase-adjusted light to form the interference pattern within the organic active material layer. Alternatively, one coherent light source may be arranged on an upper or lower surface of the organic active material layer, whereas a reflective layer is formed on the other surface of the organic active material layer on which the coherent light source is not arranged, and the coherent light source radiates phase-adjusted light to form the interference pattern within the organic active material layer.

In the case of varying the intensity of light according to the depth of the organic active material layer using an interference pattern as described above, the relationship between the thickness of the organic active material layer and the wavelength (λ) of light may satisfy the condition that the thickness of the organic active material layer is an n multiple of λ/4, where n is a natural number. However, the present invention is not limited to this relationship.

In a method of fabricating an OLED according to another embodiment of the present invention, the at least one photoreactive material may respond differently depending on the characteristics of light. When light beams having different characteristics are radiated onto the organic active material layer, the light beams having different characteristics are respectively radiated onto the opposing surfaces of the organic active material layer from different directions. The characteristic of light may be at least one of intensity, wavelength, polarization, and incident angle. Alternatively, the at least one photoreactive material may include at least two materials which respond to light having specific characteristics. In this case, when light is radiated onto the organic active material layer, light beams having different characteristics are radiated onto the opposing surfaces of the organic active material layer from different directions.

The at least one photoreactive material may include a material whose molecular orientation varies depending on the characteristic of radiated light. The at least one photoreactive material may be a material whose molecules are oriented to have an order parameter which varies depending on the characteristic of radiated light.

The molecular orientation structure of the organic active layer may be varied to obtain a carrier mobility gradient with a hole mobility which gradually decreases from an anode toward a cathode and an electron mobility which gradually increases from the anode toward the cathode.

According to another aspect of the present invention, there is provided an OLED including an anode; a cathode; and at least one organic active layer arranged between the anode and the cathode, wherein the organic active layer includes at least one material selected from among an organic emitting material, an electron transporting material, and a hole transporting material, and at least one photoreactive material and the organic active layer has a molecular orientation structure which gradually varies, resulting in a carrier mobility gradient according to the depth of the organic active layer.

The organic active layer may have a molecular orientation structure having a carrier mobility gradient with a hole mobility which gradually decreases from an anode toward a cathode and an electron mobility which gradually increases from the anode toward the cathode. The at least one photoreactive comprises one of a photopolymerizable material a photoisomerizable material, and a photodecomposable material.

In an OLED according to another embodiment of the present invention, the photoreactive material may be a photopolymerizable material, and molecules of the photoreactive material polymerize to a degree of polymerization which gradually varies according to the depth of the organic active layer.

In an OLED according to another embodiment of the present invention, the photoreactive material may be a photoorientable material, and molecules of the photoreactive material orientate in a direction which gradually varies according to the depth of the organic active layer. Alternatively, molecules of the photoreactive material may be arranged to have an order parameter which gradually varies according to the depths of the organic active layer.

In the OLEDs according to the present invention described above, the organic active layer may further include a p-type or n-type dopant that increases electrical conductivity. In addition, the at least one material selected from among an organic emitting material, an electron transporting material, and a hole transporting material may be a photoreactive material.

In general, an OLED includes an organic emission layer (EML) containing an organic emitting material between an anode and a cathode. Optionally, the OLED may include a hole transporting layer (HTL) between the EML and the anode and an electron transporting layer (ETL) between the EML and the cathode. The organic active layer described in the present invention may be one of the EML, the HTL and the ETL depending on its component, or may a layer simultaneously performing the functions of at least two of the listed layers.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Embodiments of the present invention will be described with reference to the appended drawings.

Figure 1:
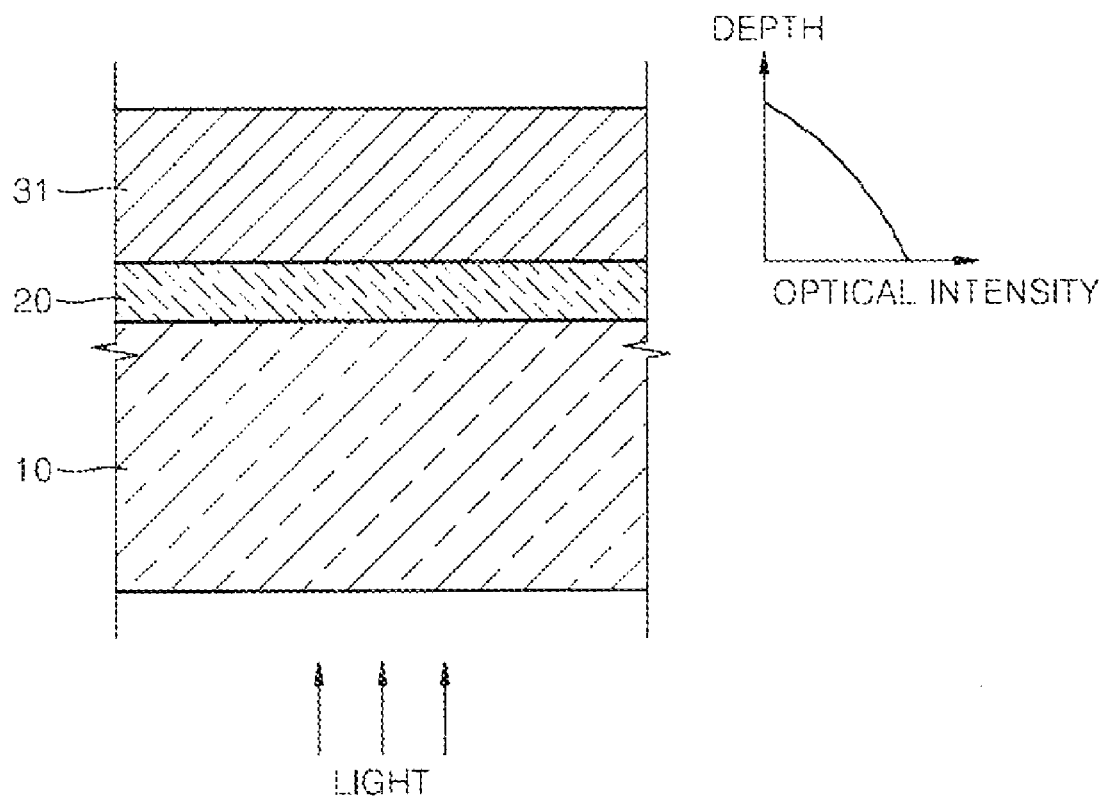
FIG. 1 is a view for illustrating a method of varying or differentiating the intensity of light absorbed by an organic active layer according to depth.

FIG. 1 is a view for illustrating a method of varying or differentiating the intensity of light absorbed by an organic active layer according to depth. Initially, an electrode 20 is formed on a substrate 10. Here, the substrate 10 may be one of a glass substrate or a transparent plastic substrate, but the present invention is not limited thereto. The substrate may also be a planar structure in which different functional structures are formed. For example, when manufacturing an active matrix type OLED display panel, a substrate may include an organic thin film transistor (OTFT) structure. The electrode 20 may be any conductive material thin film which can function as an anode or a cathode depending on the applied voltage. In the current embodiment, the substrate 10 and the electrode 20, both of which are optically transparent, and the electrode 20 functioning as an anode are described as an example. An example of a material for the transparent electrode 20 includes indium tin oxide (ITO).

An organic active material layer 31 is formed on the electrode 20 using a solution process. In other words, a solution of various organic active materials dissolved in a solvent is prepared, and the prepared organic active material solution is coated in the form of a thin film using a wet process, such as spin coating, inkjet printing and the like. The process of coating the organic active material solution may be one of spin coating, gravure printing, roll-to-roll processing, syringe injection, dip coating, spray coating, relief printing, lithography printing, flexography printing, and screen printing.

Throughout the specification the thin film in which molecules are not yet arranged in a desired orientation is referred to as the organic active material layer 31, and the thin film after the arrangement of molecules is implemented is referred to as an organic active layer (not shown). The organic active material solution may contain at least one of the materials, such as a hole transporting material, an organic emitting material, and an electron transporting material, which will be disposed between an anode and a cathode. All or some of the materials listed above, for example, only the hole transporting material and the organic emitting material, may be contained in the organic active material solution. In the current embodiment, the latter case is described. Here, the function of the final organic active layer is determined depending on the kinds of materials contained in the organic active material solution. In other words, the organic active layer may be formed as a layer having one of the functions of a hole transporting layer (HTL), an organic emission layer (EML) or an electron transporting layer (ETL), or may be formed as a layer performing at least two of the functions.

The organic active material solution contains at least one photoreactive material which may be photoorientable material. The reaction of the photoreactive material to light may be photopolymerization, photoisomerization, or photodecomposition. The reaction of the photoreactive material varies depending on the kind of the photoreactive material. Any photoreactive materials whose molecular arrangement structure can be varied by the irradiation of light, irrespective of the type of photoreaction involved, can be used. Such photoreactive materials may be a charge transporting material, an electron emitting material, or a material forming a matrix of the organic active layer.

In the current embodiment a photoreactive material including photopolymerization will be described in detail. Examples of such materials including photopolymerization include poly-TPBOX(N,N'-bis-[4(3-ethyl-oxetane-3-yimethoxy)-methylphenyl]-N,N'-bis(phenyl)-benzidine].
This material is dissolved in an organic solvent in the form of monomer and is photopolymerized by the irradiation of ultraviolet (UV) light. However, the material is not dissolved in an organic solvent in the form of polymer. This poly-TPBOX in the form of polymer is known as a hole transporting material. Examples of such materials which are photopolymerizable and which can transport holes include materials having an oxetane terminal group, for example, 3-ethyl-3-hydroxymethyloxetane, 1-(4-Bromophenyl)-6-bromohexane, 3-[6-(4-Bromophenyl) hexyloxymethyl]-3-ethyloxetane, N,N'-Di{4-[6-(3-ethyloxetane-3-yl-methoxy)]hexylphenyl}-N,N'-diphenylbenzidine.

According to an exemplary embodiment, such a hole transporting, photopolymerizable material is dissolved in a solvent together with the organic emitting material in order to prepare an organic active material solution. Next, the organic active material solution is coated by spin coating to form the organic active material layer 31. As illustrated in FIG. 1, light, for example, UV light, with an appropriate intensity, is then radiated into the organic active material layer 31 through the substrate 10. In addition in order to facilitate photopolymerization, a small amount of a photoinitiator, for example, of no more than 0.1%, may be added. Examples of such a photoinitiator include {4-[(2-hydroxytetradecyl)-oxyl]-phenyl}-phenyl iodonium hexafluoroantimonate and the like. In radiating light, the optical intensity may be controlled so that the intensity of light reaching inside the organic active material layer 31 has a gradient profile in which the optical intensity decreases withgetting closer to the surface of the organic active material layer 31, as illustrated in FIG. 1. As a result, in the organic active material layer 31, the polymerized hole transporting material has a gradient density distribution. In other words, in a region of the organic active material layer 31 which is close to the electrode 20 the polymerization density of the photopolymerizable, hole transporting material increases, resulting in a molecular arrangement suitable for hole injection. However, in a region of the organic active material layer 31 which is away from the electrode 20, the polymerization density of the photopolymerizable, hole transporting material decreases while the proportion of the organic emitting material increases. As a result, the organic emitting material is mainly distributed in the uppermost region of the organic active material layer 31.

Through this process, in the cured organic active layer, a gradient junction, in which the composition of the hole transporting material and the organic emitting material continuously varies, is formed. As a result, the organic active layer has a gradient profile in carrier mobility, other electrical characteristics, such as electrical resistance, and optical characteristics. This means that the efficiency and lifespan of the organic light emitting device (OLED) can be improved. The relationship between such a gradient junction and the efficiency and lifespan of organic light emitting devices was identified with a low molecular weight OLED having a gradient junction structure.

Although not illustrated in FIG. 1, after the organic active layer with a gradient distribution of the hole transporting material and the organic emitting material is formed as described above, an additional organic active layer with a gradient distribution of the organic emitting material and an electron transporting material may be formed by a similar method as described above on the organic active layer.

Meanwhile, in order to effectively induce an optical intensity gradient in the organic active material layer 31, the organic active material layer 31 may be formed to be thicker than common organic active layers. However, the thickness of the organic active layer increases, it may need to increase the driving voltage. In order to prevent this, an n-type or p-type dopant may be added to the organic active layer.

As an example, a method of inducing an optical intensity gradient while maintaining the thickness of the organic active layer at hundreds of nanometers will be described below. Unlike the embodiment described with reference to FIG. 1, in which a common UV light source is used, a coherent light source, for example, a laser source, may be used in the embodiment described below.

Figure 2A:
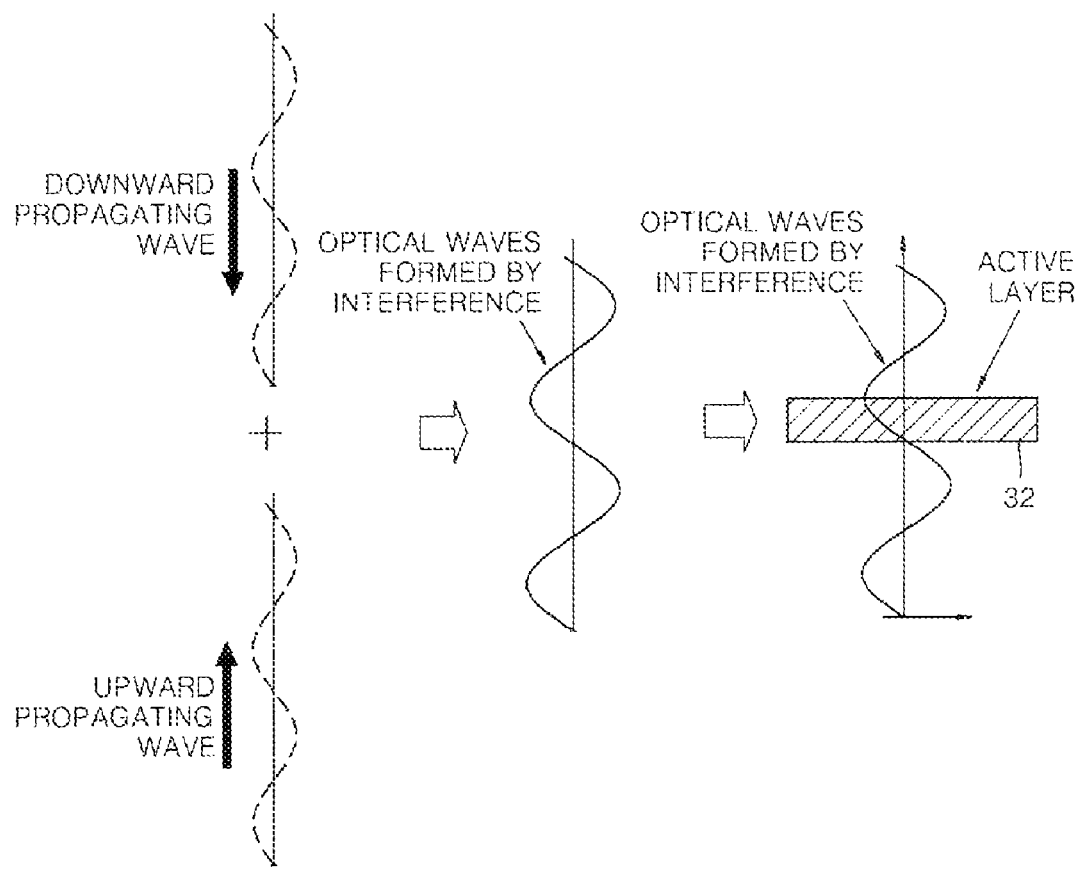
FIG. 2A illustrates a case where the optical density in the organic active material layer varies according to depth due to the interference of single-wavelength beams radiated in opposite directions.

FIG. 2A illustrates a case where the optical density in the organic active material layer varies according to depth due to the interference of single-wavelength beams radiated in opposite directions. If is well known that optical coherence, and in particular, constructive interference, can be induced by controlling the phase of optical waves radiated from two coherent light sources. As illustrated in FIG 2A, phase-adjusted beams are radiated onto an organic active material layer 32 from opposite directions in order to induce constructive interference between the two beams in the organic active material layer 32. An interference pattern as illustrated in FIG. 2A can be formed by controlling the phrasal relationship between the two beams radiated from the opposite directions and the distance between the two coherent light sources and the organic active material layer 32. The optical density gradient induced by such an interference pattern can lead to a gradient molecular orientation in the organic active material layer 32 as the organic active material layer 32 cures, as in the embodiment described with reference to FIG. 1.

Figure 2B:
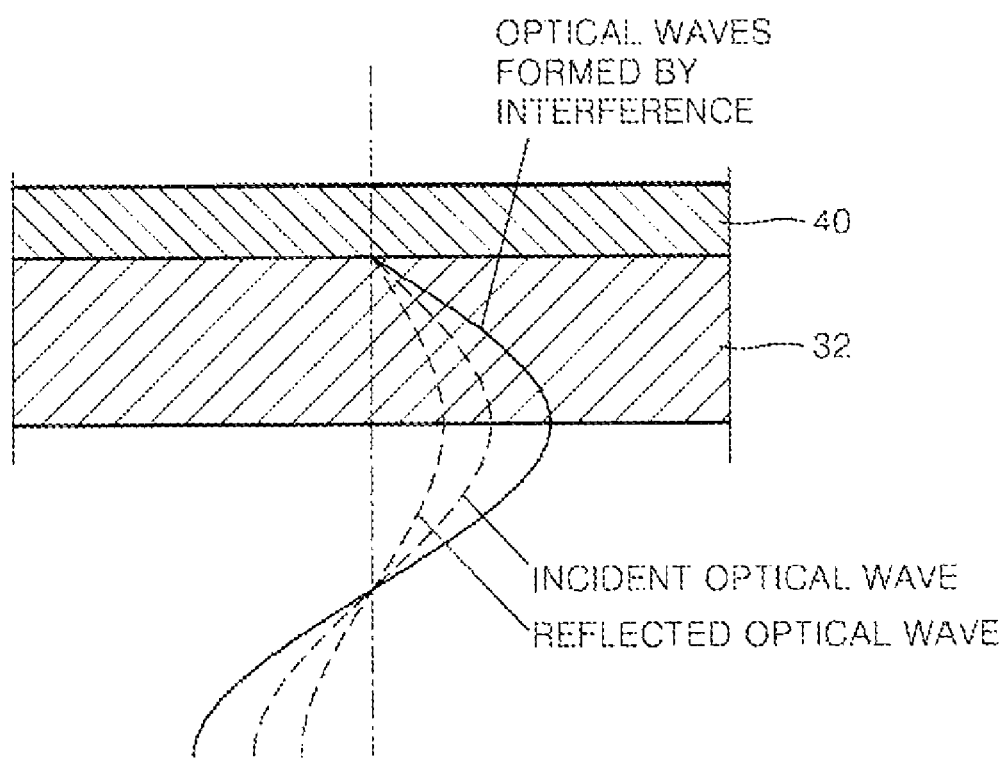
FIG. 2B illustrates a case where the optical intensity variation due to the interference between an incident optical wave and a reflected optical wave in the organic active material layer varies according to depth.

FIG. 28 illustrates a case where the optical intensity variation due to the interference between an incident optical wave and a reflected optical wave in the organic active material layer varies according to depth. When a surface of the organic active material layer 32 has a high reflectivity, for example, when a metallic upper electrode (generally, a cathode) 40 is formed on a surface of the organic active material layer 32 in order to manufacture a bottom emission organic light emitting device, a single-wavelength beam may be radiated onto a surface of the organic active material layer 32 with a lower reflectivity (for example, onto a surface close to a substrate (not shown) and an electrode (not shown)? In this case, the interference between the incident optical wave and the reflected optical wave can be induced by adjusting the phase of the beam and the distance between the light source and the organic active material layer 32. In other words, an interference pattern can be induced in the organic active material layer 32, as illustrated in FIG. 2B. This leads to a gradient in the molecular orientation of the organic active material layer 32 as the organic active material layer 32 cures.

As in the two examples described above, when a gradient optical density is induced in the organic active material layer 32, the relationship between the thickness of the optical active material layer 32 and the wavelength ($\lambda$) of radiated light may satisfy the condition that the thickness of the optical active material layer 32 is equal to approximately $\lambda/4$. However, the thickness of the organic active material layer may be equal to an n multiple of $\lambda/4$, where n is a natural number, depending on the type of reaction of the photoreactive material in the organic active material layer 32 to the optical intensity.

Figure 3:
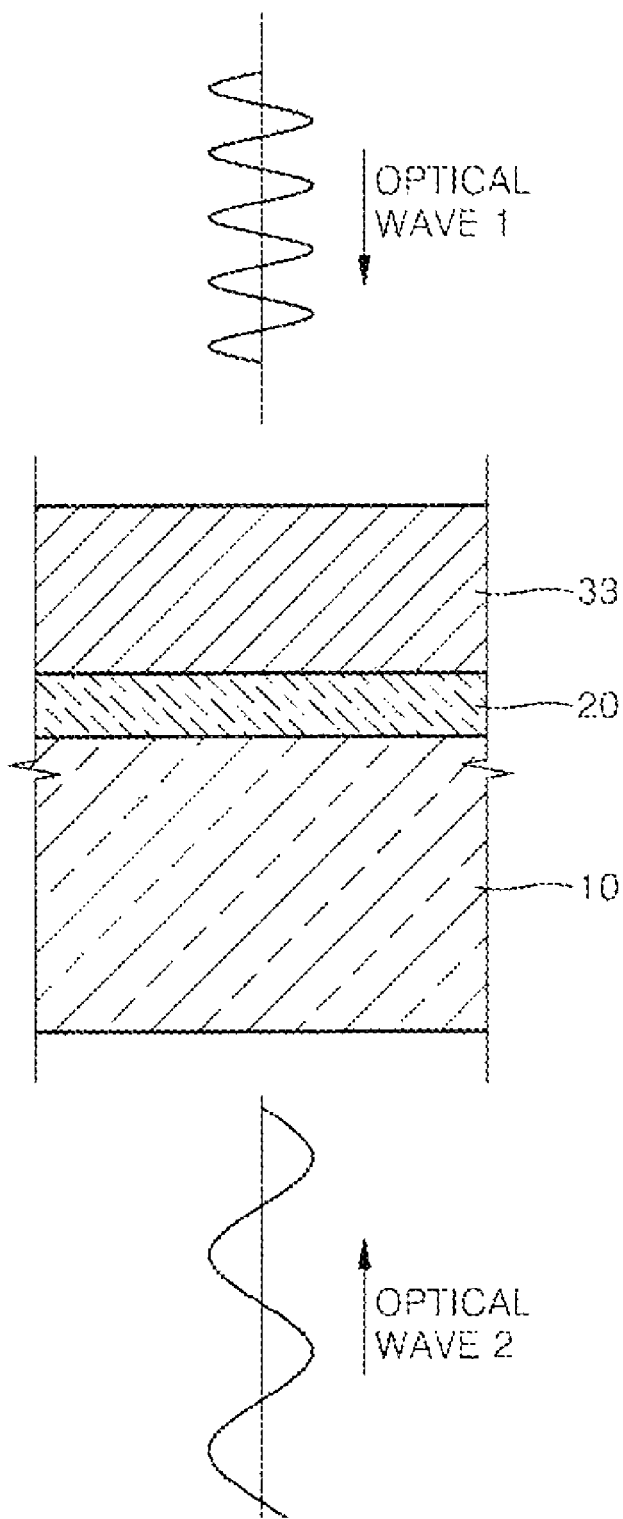
FIG. 3 illustrates a case where light having different wavelengths are radiated onto an organic active material layer from opposite directions.

FIG. 3 illustrates a case where light having different wavelengths are radiated onto an organic active material layer from opposite directions. For example, when an organic active material layer 33 contains at least two photoreactive materials which are reactive to different wavelengths of light, light having the different wavelengths, which are reactive with the photoreactive materials, may be radiated onto the organic active material layer 33 from the opposite directions. In particular, the organic active material layer 33 may contain a mixture of a hole transporting, photopolymerizable material that is polymerizable by light having a first wavelength (hereinafter, "optical wave 1"), an electron transporting, photopolymerizable material that is polymerizable by light having a second wavelength (hereinafter, "optical wave 2"), and an organic emitting material. Here, the optical wave 2 is radiated from a direction close to the electrode 20, which is an anode, whereas the second wave 1 is radiated from the opposite direction. As a result, the hole transporting material is polymerized at a high density in a region of the resulting organic active layer close to the anode, whereas the electron transporting material is polymerized at a high density in a region of the organic active layer close to the cathode. In addition, in the middle of the organic active layer the organic emitting material is distributed at a high density.

In the current embodiment, the method of radiating light having different wavelengths onto the opposing surfaces of the organic active material layer 33 from different directions has been described as an example. The present invention is not limited to this example, and similar results as this example can be obtained by radiating light having different intensities, different polarization characteristics or different incident angles onto the opposing surfaces of the organic active material layer depending on the used photoreactive material.

In another embodiment of the present invention, using a photoreactive material whose molecular orientation direction is determined depending on a characteristic (for example, wavelength, intensity, polarization characteristic, or incident angle) of radiated light, the molecular orientation direction in the organic active layer of an OLED can be gradually varied according to the depth of the organic active layer. For example, in a region of the organic active layer, charge transporting molecules are arranged in a direction parallel to the direction in which an electric field is applied to the OLED, thereby increasing the mobility of holes. In another region of the organic active layer, the charge transporting molecules are arranged in a direction perpendicular to the direction in which the electric field is applied, thereby lowering the mobility of holes and raising the mobility of electrons.

Figure 4:
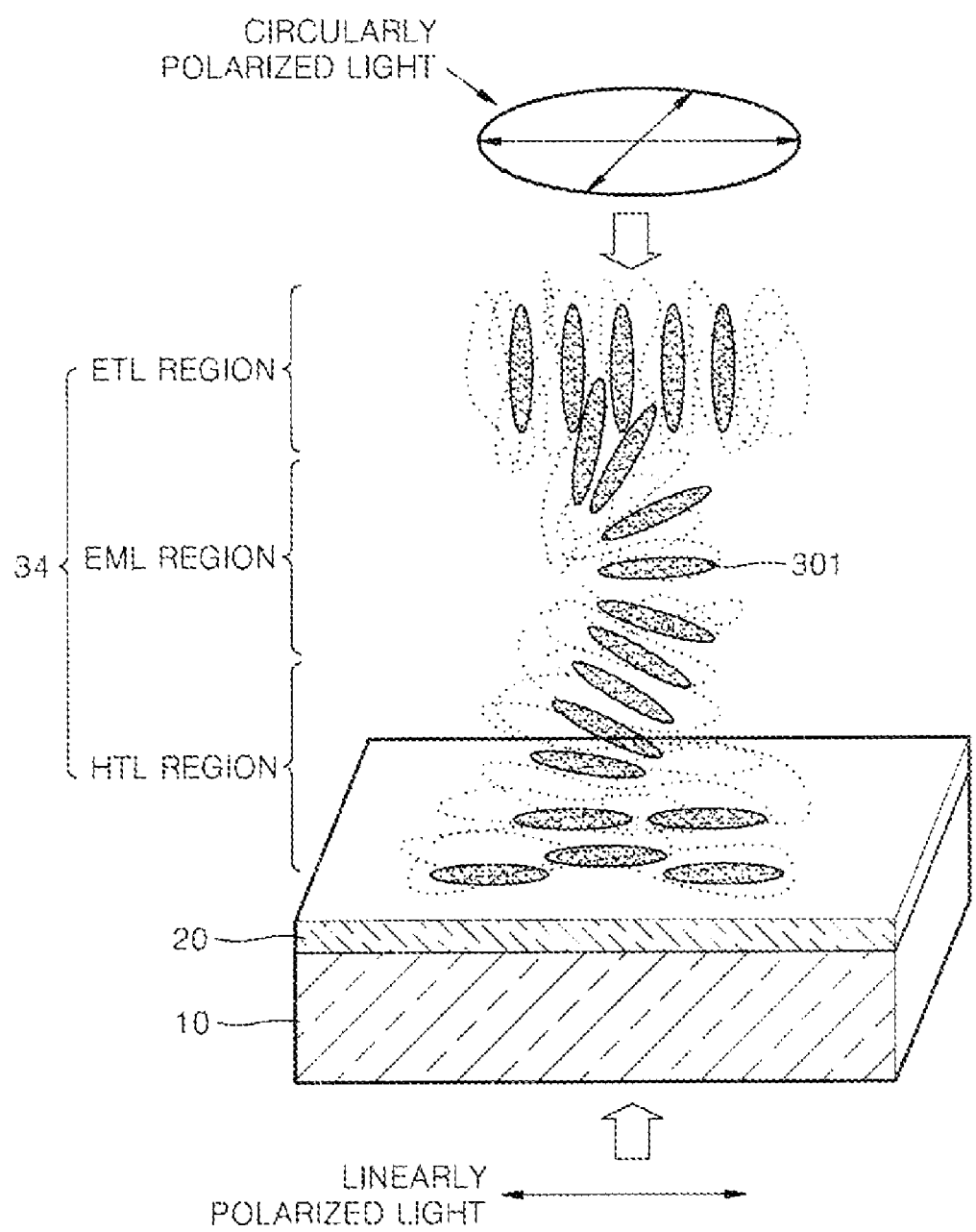
FIG. 4 illustrates a state of molecular orientation of a photoreactive material by the combination of circularly polarized light and linearly polarized light radiated from opposite directions.

FIG. 4 illustrates a state of molecular orientation of a photoreactive material by the combination of circularly polarized light and linearly polarized light radiated from opposite directions. In the current embodiment, initially an organic active material layer 34 is formed. The organic active material layer 34 includes a photoreactive material (in the form of monomer) whose molecules are oriented depending on the polarization characteristic of light radiated onto the electrode 20 (i.e., anode). During a process of curing the organic active material layer 34, light having different polarization characteristics is radiated onto the organic active material layer 34 from the opposite directions so that the photoreactive material is polymerized while being oriented in an intended direction. Such a photoreactive material may be a material which is mixed into the organic active material layer 34 in the form of monomer and which has liquid crystalline properties at room temperature.

In order to photocure the organic active material layer 34 formed by spin coating, as illustrated in FIG. 4, circularly polarized light may be radiated onto the organic active material layer 34 from upward to downward, whereas linearly polarized light, which is parallel to the substrate 10, may be radiated onto the organic active material layer 34 from downward to upward. As a result, in a region of the organic active material layer 34 adjacent to the substrate (anode) 20, molecules 301 of the photoreactive material polymerize while being oriented in the direction of the linearly polarized light, i.e., in the direction parallel to the substrate 10. At this time, charge transporting molecules doped into the organic active material layer 34 are oriented in the same direction as the molecules of the photoreactive material. Thus, by properly determining the direction of linearly polarized light, the doped charge transporting molecules can be oriented in a direction in which the hole transporting ability is improved, to be suitable for hole injection and transport. In a region of the organic active material layer 34 adjacent to an upper electrode (cathode, not shown), the molecules 301 of the photoreactive material polymerize while being oriented in a direction perpendicular to the substrate 10 by the circularly polarized light. At this time, the charge transporting materials doped into the organic active material layer 34 are oriented in a direction perpendicular to the substrate 10 to be suitable for electron injection and transport. As a result, the organic active material layer 34 is cured, resulting in a HTL region adjacent to the anode that has a molecular orientation structure suitable for hole transport, an ETL region adjacent to the cathode that has a molecular orientation structure suitable for electron transport, and an organic EML region between the HTL region and the ETL region. In other words, an effective mobility gradient is formed in the cured organic active layer.

As in the embodiment described above, the photoreactive material may be a material forming a matrix of the organic active layer. However, the present invention is not limited to this example, and the photoreactive material may be a material having electron emitting characteristics. For example, PFO (poly[(9,9-dioctylfluoren-2,7-diyl]), which is an organic emitting material, has a liquid crystalline property at room temperature when it is in the form of a monomer. Of course, PFO can be used as the photoreactive material.

Figure 5A:
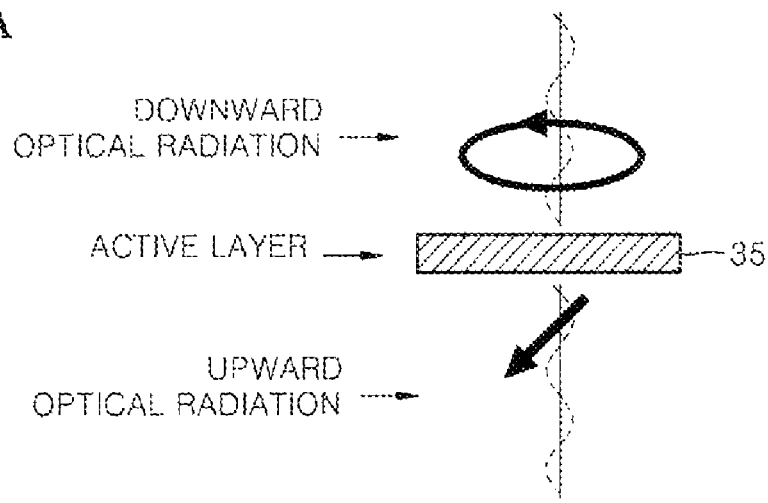
FIGS. 5A through 5C illustrate examples of different combinations of polarized light radiated onto an organic active material layer from two different directions in the photocuring process.
Figure 5B:
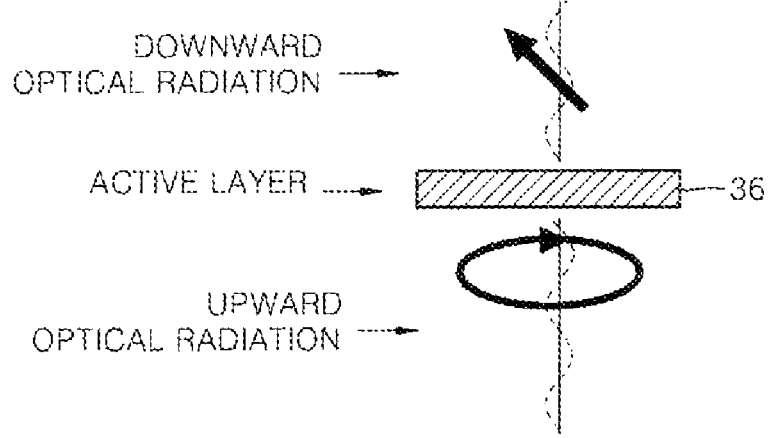
Figure 5C:
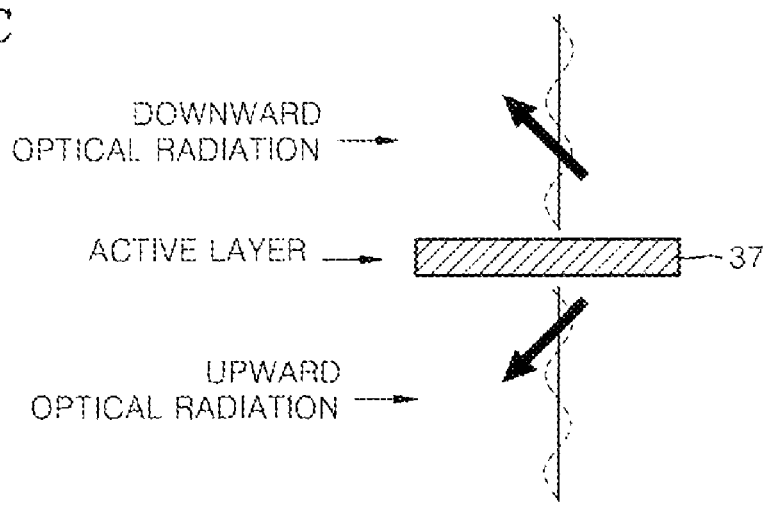

FIGS. 5A through 5C illustrate examples of different combinations of polarized light radiated onto an organic active material layer from two different directions in the photocuring process. Depending on the reaction characteristics of the photoreactive material to polarized light, other combinations of polarized light than the example in FIG. 4 can be applied. In other words, for organic active material layers 35, 36, and 37, which contain different photoreactive materials (having different reaction characteristics to polarized light), various combinations of polarized light which are suitable for the characteristics of the photoreactive materials, can be radiated onto the opposing surfaces of the organic active material layers 35, 36, and 37. FIG. 5A illustrates a combination of left-circularly polarized light and linearly polarized light, FIG. 5B illustrates a combination of linearly polarized light and right-circularly polarized light, and FIG. 5C illustrates a combination of two linearly polarized light beams perpendicular to each other.

Although the previous embodiments have been described with reference to the photoreactive material which is reactive to the polarization characteristics of radiated light, similar results as above can be obtained by the combination of different wavelengths, different intensities, or different incident angles of light radiated onto the opposing surfaces of the organic active material layer depending on the kind of the used photoreactive material.

Figure 6:
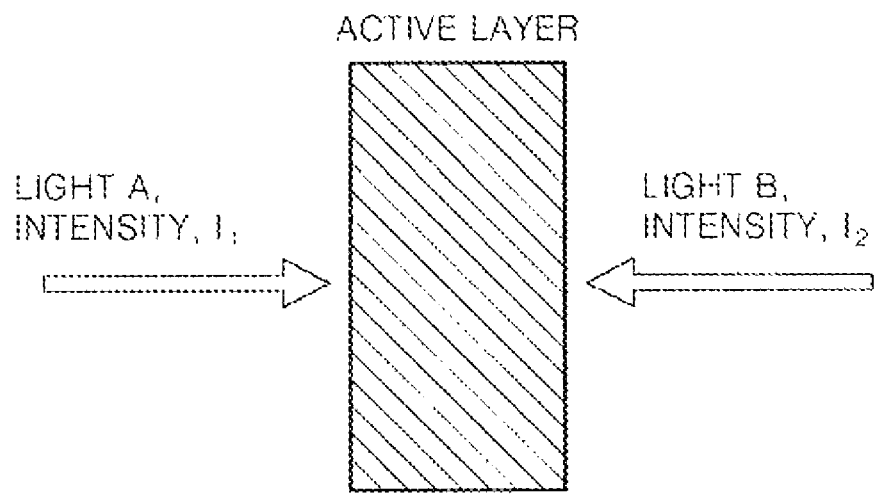
FIG. 6 illustrates an example of radiating light having different intensities onto the both surfaces of an organic active layer.

FIG. 6 illustrates an example of radiating light having different intensities onto the both surfaces of an organic active layer. The molecular orientation structure of the photoreactive material, for example, the degree of polymerization, density, orientation, order parameter, and the like, of the photoreactive material molecules varies depending on the intensity of light. Thus, the mobility of charges can be changed by varying the intensity of radiated light. A gentle gradient in the charge mobility of the organic active material layer can be achieved by varying the intensities of incident light radiated onto the opposing surfaces of the organic active material layer depending on the characteristics of the photoreactive material.

Figure 7:
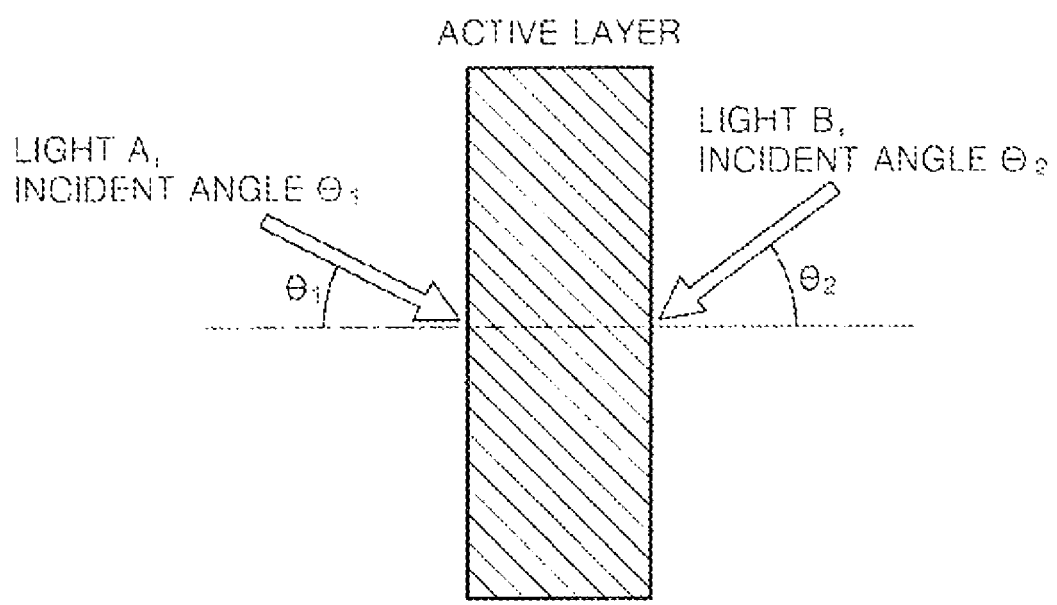
FIG. 7 illustrates an example of radiating light onto the both surfaces of an organic active layer at different incident angles.

FIG. 7 illustrates an example of radiating light onto the both surfaces of an organic active layer at different incident angles. The molecular orientation structure in surface regions of the organic active material layer varies depending on the incident angle of light, thereby affecting the distribution of charge mobility. Thus, a gentle gradient in the charge mobility of the organic active material layer can be achieved by varying the incident angles of light radiated onto the opposing surfaces of the organic active material layer depending on the characteristics of the photoreactive material.

Figure 8:
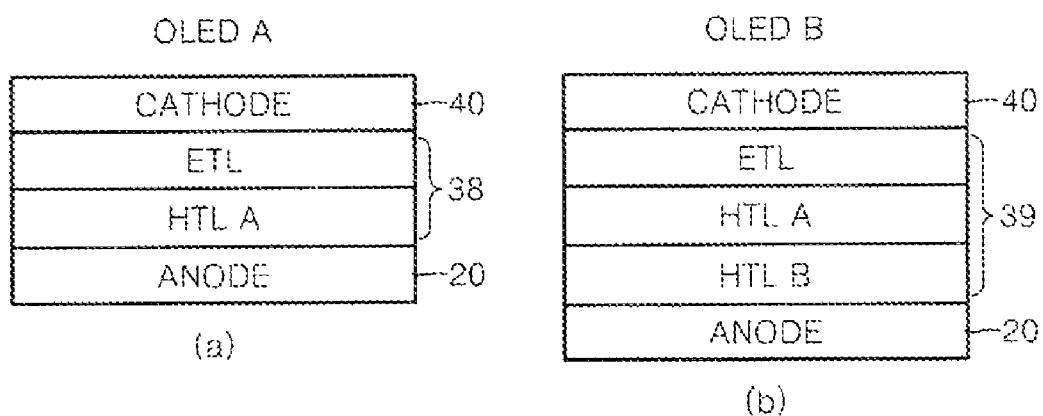
FIG. 8 illustrates an OLED A having a hole transporting layer (HTL) with a uniform charge mobility and an OLED B having an HTL with a charge mobility gradient.
Figure 9:
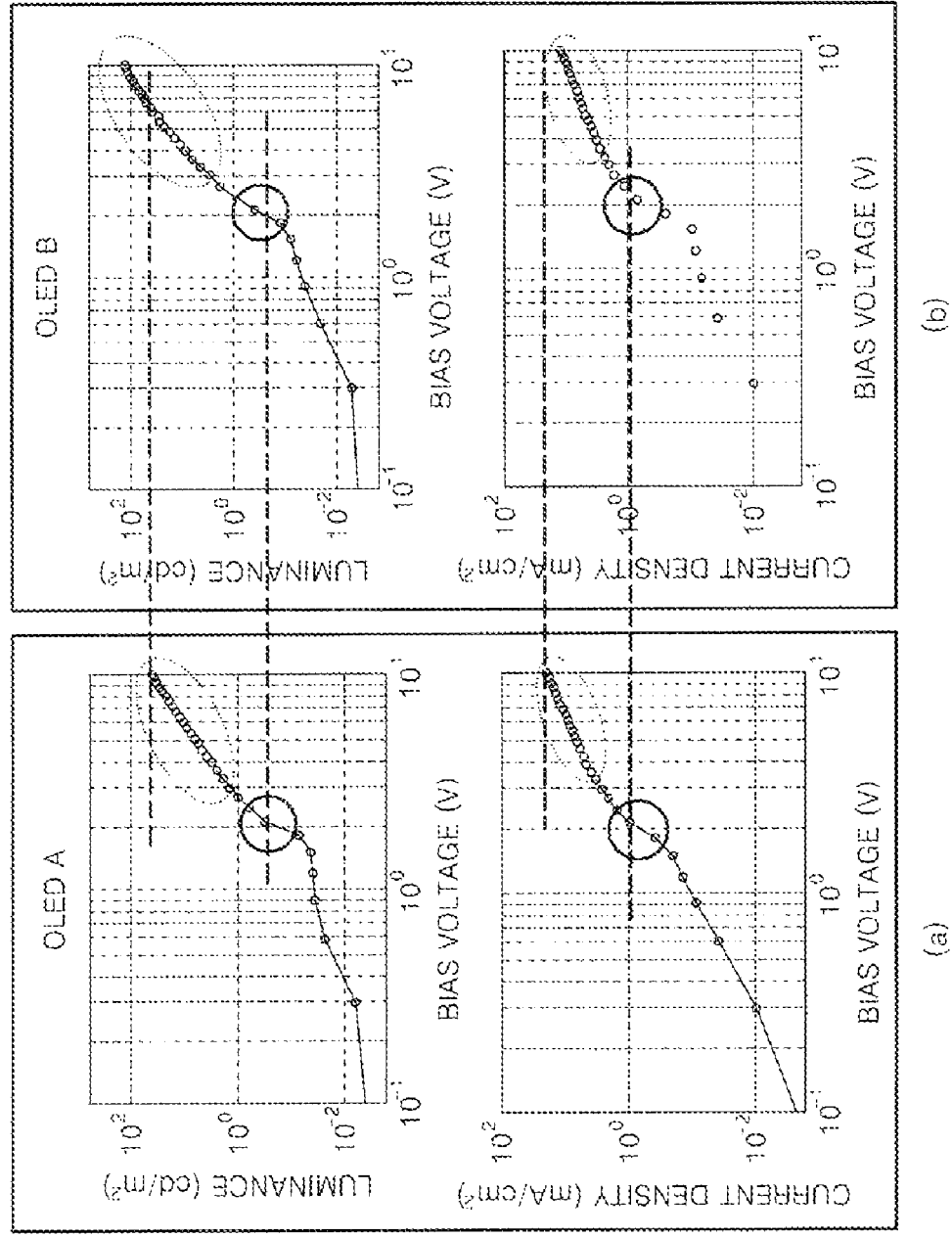
FIG. 9 illustrates applied bias voltage, current density, and luminance characteristics (a) for the OLED A in FIG. 8 and applied bias voltage, current density, and luminance characteristics (b) for the OLED B in FIG. 8.

FIG. 8 illustrates an OLED A having a hole transporting layer (HTL) with a uniform charge mobility and an OLED B having an HTL with a charge mobility gradient. FIG. 9 illustrates applied bias voltage, current density, and luminance characteristics (a) for the OLED A in FIG. 8 and applied bias voltage, current density, and luminance characteristics (b) for the OLED B in FIG. 8. In the OLED A in (a) of FIG. 8, there is no gradient in hole mobility, and the OLED A has a stacked structure including, from bottom to top, an anode 20, an organic active layer 38, which includes a HTL A (having a thickness of 60 nm) and an ETL (having a thickness of 60 nm), and a cathode 40. In the OLED B in (b) of FIG. 8, there is a gradient in hole mobility, and the OLED B has a stacked structure including, from downward, the anode 20, an organic active layer 39, which includes an HTL A (having a thickness of 30 nm), an HTL B (having a thickness of 30 nm), and an ETL (having a thickness of 60 nm), and the cathode 40. In the OLED B, the HTL A has a hole mobility of $1 \times 10^{-6}$ cm$^2$/Vs, and the HTL B has a hole mobility of $1 \times 10^{-4}$ cm$^2$/Vs, indicating that the hole mobility of the OLED B is higher closer to the anode 20. In addition, as illustrated in FIG. 9, the OLED B shows a higher current efficiency than OLED A, with a lower current density and a higher luminance at the same applied voltage than the OLED A. This comparative experiment shows that an OLED with a charge mobility gradient has higher performance characteristics.

Hereinafter, exemplary embodiments of an OLED according to the present invention will be described in detail.

Figure 10:
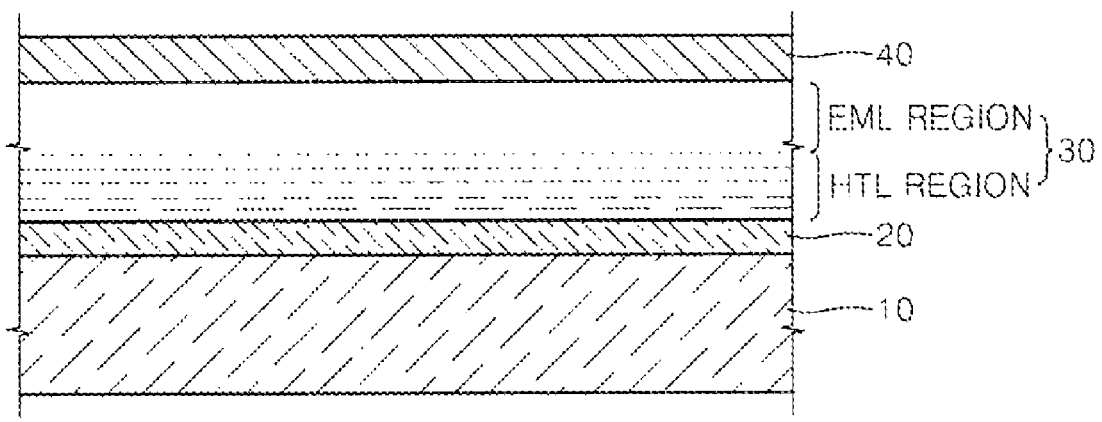
FIG. 10 illustrates an OLED according to an embodiment of the present invention.

FIG. 10 illustrates an OLED according to an embodiment of the present invention. In the current embodiment, an organic active layer 30 having both the functions of an HTL and an organic EML is arranged between an anode 20 arranged on a substrate 10 and a cathode 40. The organic active layer 30 includes a hole transporting material and an organic emitting material, wherein the hole transporting material may be a photopolymerizable material. This organic active layer 30 may have, through the light radiating process described with reference to FIGS. 1, 2A and 2B, a distribution with a higher degree of polymerization of the hole transporting material (designated by longer dashed lines) closer to the anode 20 and a lower degree of polymerization of the hole transporting material (designated by shorter dashed lines) closer to the cathode 40. As a result, the HTL region of the organic active layer 30 may have a gradient hole mobility varying according to the depth of the organic active layer 30. Although the current embodiment is described with reference to an example of using a photopolymerizable material as the hole transporting material, similar results as in the current embodiment can be obtained using a material whose molecular order parameter varies by light irradiation.

Figure 11:
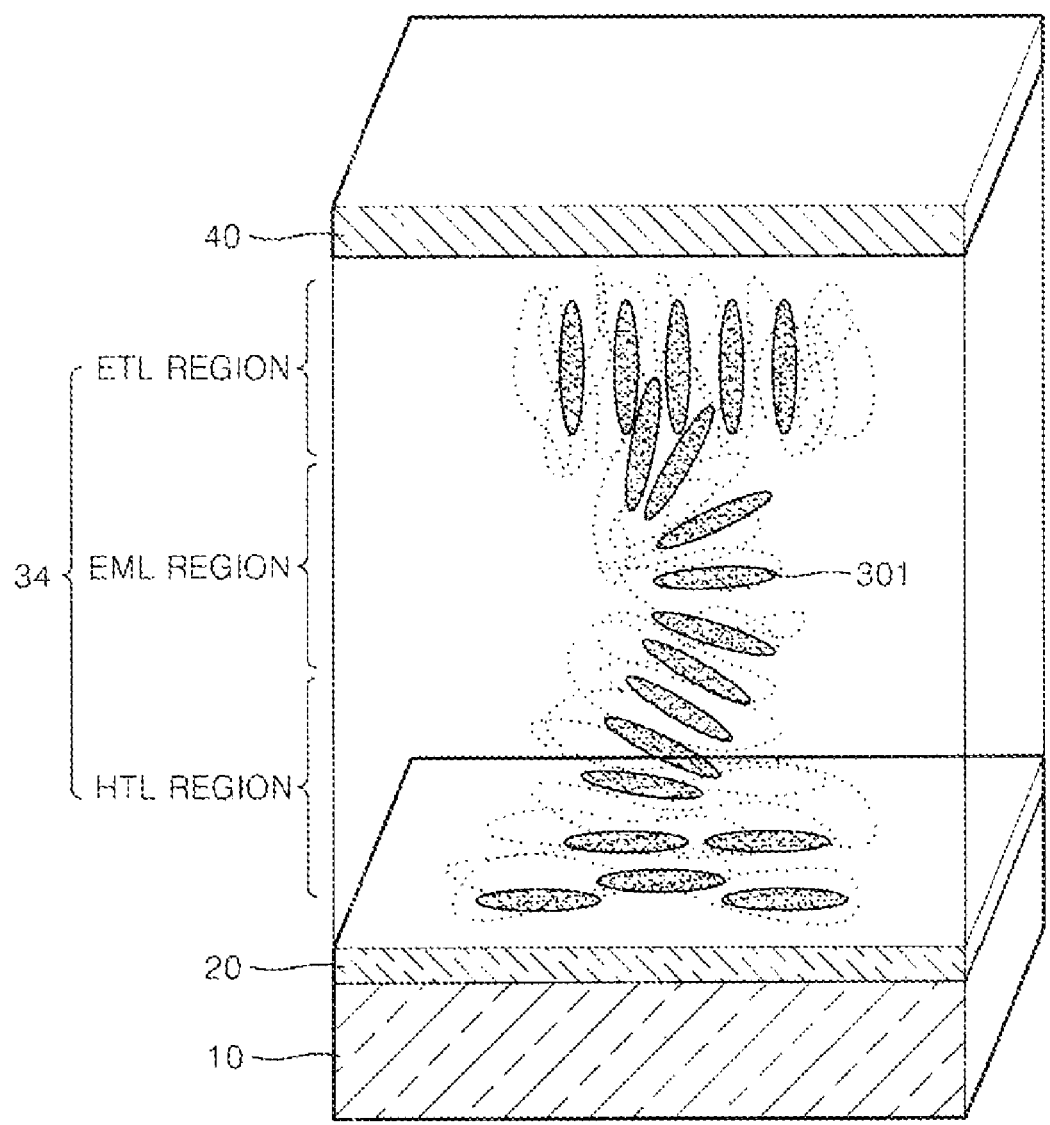
FIG. 11 illustrates an OLED according to another embodiment of the present invention.

FIG. 11 illustrates an OLED according to another embodiment of the present invention. The OLED according to the current embodiment can be manufactured using the method described with reference to FIG. 4. As illustrated in FIG. 4, the molecules 301 of the photoreactive material are oriented differently in depths of the organic active layer 34 depending on the characteristic of light which has reached the depth. As a result, the hole transporting material, the organic emitting material, and the electron transporting material, which are included in the organic active layer 34, may be distributed in the orientation direction of the molecules 301 of the photoreactive material. Finally, a molecular orientation structure suitable for hole injection and transport may be formed in an HTL region close to the anode 20, whereas a molecular orientation structure suitable for electron injection and transport may be formed in an ETL region close to the cathode 40. Since the molecules 301 of the photoreactive material are oriented differently according to the depths of the organic active layer 34, the mobility of charges also has a gradient according to the depths of the organic active layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating an organic light emitting device, the method comprising:

forming an electrode on a lower substrate;

depositing an organic active material solution containing at least one photoreactive material on the electrode on the lower substrate to form an organic active material layer; and radiating light onto the organic active material layer so that the characteristics of the light varies according to the depth of the organic active material layer in order to gradually vary the molecular orientation structure in the organic active material layer according to the depths, thereby resulting in a carrier mobility gradient according to the depths of the organic active material layer.

2. The method of claim 1, wherein the at least one photoreactive material comprises one of a photopolymerizable material, a photoisomerizable material, and a photodecomposable material.

3. The method of claim 1, wherein the organic active material layer includes at least one selected from among an organic emitting material, an electron transporting material, and a hole transporting material.

4. The method of claim 1, further comprising adding a p-type or n-type dopant that increases electrical conductivity to the organic active material layer.

5. The method of claim 2, wherein the least one photoreactive material includes a photopolymerizable material, and the photopolymerizable material is mixed into the organic active material solution in the form of monomer and then polymerized into a molecular orientation structure which varies depending on the intensities of light radiated onto the organic active material layer.

6. The method of claim 1, wherein the organic active material solution further comprises a photoinitiator.

7. The method of claim 1, wherein the at least one photoreactive material differently responds to light having different characteristics, and in the radiating of light onto the organic active material layer, lights having different characteristics are radiated onto both surfaces of the organic active material layer from opposite directions.

8. The method of claim 1, wherein, in the radiating of light onto the organic active material layer, a coherent light source is used to form an interference pattern of light with an intensity gradient which varies according to the depth of the opposite active material layer.

9. The method of claim 8, wherein two coherent light sources are arranged on upper and lower surfaces of the organic active material layer to face each other, and the two coherent light sources radiate phase-adjusted light to form the interference pattern within the organic active material layer.

10. The method of claim 8, wherein one coherent light source is arranged on an upper or lower surface of the organic active material layer, whereas a reflective layer is formed on the other surface of the organic active material layer on which the coherent light source is not arranged, and the coherent light source radiates phase-adjusted light to form the interference pattern within the organic active material layer.

11. The method of claim 8, wherein the relationship between the thickness of the organic active material layer and the wavelength ($\lambda$) of light satisfies the condition that the thickness of the organic active material layer is an n multiple of $\lambda/4$, where n is a natural number.

12. The method of claim 7, wherein the different characteristics of the lights radiated from upper direction and lower direction are selected from the one or the combination of their intensity, wavelength, polarization, and incident angle, respectively.

13. The method of claim 1, wherein the at least one photoreactive material includes a material whose molecular orientation varies depending on the characteristic of radiated light.

14. The method of claim 1, wherein the molecular orientation structure of the organic active layer is varied to obtain a carrier mobility gradient with a hole mobility which gradually decreases from an anode toward a cathode and an electron mobility which gradually increases from the anode toward the cathode.

15. An organic light emitting device comprising:

an anode;

a cathode; and at least one organic active layer arranged between the anode and the cathode, wherein the organic active layer includes at least one material selected from among an organic emitting material, an electron transporting material, and a hole transporting material, and at least one photoreactive material and the organic active layer has a molecular orientation structure which gradually varies, resulting in a carrier mobility gradient according to the depth of the organic active layer.

16. The organic light emitting device of claim 15, wherein the organic active layer has a molecular orientation structure having a carrier mobility gradient with a hole mobility which gradually decreases from an anode toward a cathode and an electron mobility which gradually increases from the anode toward the cathode.

17. The organic light emitting device of claim 15, wherein the at least one photoreactive comprises one of a photopolymerizable material, a photoisomerizable material, and a photodecomposable material.

18. The organic light emitting device of claim 15, wherein the photoreactive material is a photopolymerizable material, and molecules of the photoreactive material polymerize to a degree of polymerization which gradually varies according to the depth of the organic active layer.

19. The organic light emitting device of claim 15, wherein the photoreactive material is a photoorientable material, and molecules of the photoreactive material orientate in a direction which gradually varies according to the depth of the organic active layer.

20. The organic light emitting device of claim 15, wherein molecules of the photoreactive material are arranged to have an order parameter which gradually varies according to the depths of the organic active layer.

21. The organic light emitting device of claim 15, wherein the organic active layer further comprises a p-type or n-type dopant that increases electrical conductivity.

22. The organic light emitting device of claim 15, wherein the at least one material selected from among an organic emitting material, an electron transporting material, and a hole transporting material is a photoreactive material.

* * * * *